United States Patent
Ho (10) Patent No.: US 7,478,271 B2
(45) Date of Patent: Jan. 13, 2009

(54) METHOD FOR RECYCLING FLASH MEMORY

(76) Inventor: Chunchun Ho, F6, No.28-2, TianMu W. Rd., Taipei City (TW)

(*) Notice: Subject to any disclaimer, the term of this patent is extended or adjusted under 35 U.S.C. 154(b) by 358 days.

(21) Appl. No.: 11/464,552

(22) Filed: Aug. 15, 2006

(65) Prior Publication Data
US 2008/0080241 A1    Apr. 3, 2008

(51) Int. Cl.
*G06F 11/00* (2006.01)

(52) U.S. Cl. .................. 714/8; 714/5; 714/723

(58) Field of Classification Search ........... None
See application file for complete search history.

(56) References Cited

U.S. PATENT DOCUMENTS 6,684,345 B2 *   1/2004   Harari et al. .......... 714/8
6,728,913 B1 *   4/2004   Parker ................ 714/723
2006/0253643 A1 *   11/2006   Blanck ................ 711/103

* cited by examiner

*Primary Examiner*—Christopher S McCarthy
(74) *Attorney, Agent, or Firm*—Schmeiser, Olsen & Watts (57) ABSTRACT

A method for recycling a flash memory includes rearranging the capacity of cells, centralizing bad sectors at a cell, labeling the cell as a useless cell, examining the bad sectors in each cell of the flash memory to determine whether or not the number of bad sectors in each cell exceeds an allowable upper limit. If the number of bad sectors exceeds the allowable upper limit, the cells of the flash memory will be rearranged, and the area with densely distributed bad sectors is marked as a new cell, and such cell is deleted. In the process of the recycling method, the number repeated uses of the flash memory exceeding the maximum number of bad sectors can be arranged to extend the life expectancy of the flash memory, so that the flash memory device originally incapable of writing and reading data can be used again.

9 Claims, 6 Drawing Sheets

METHOD FOR RECYCLING FLASH MEMORY

FIELD OF THE INVENTION

The present invention relates to a method for recycling a flash memory, and more particularly to a method for recycling a flash memory by rearranging the cells in the flash memory.

BACKGROUND OF THE INVENTION

In a flash memory, the basic storage unit is a cell. Unlike traditional memories that only have a layer of gate oxide, the flash memory adds a floating gate between a gate and a channel in a metal oxide semiconductor (MOS), such that the flash memory can have three operating modes: write, read and erase. If an electron is added to the floating gate, the value of 0 will overwrite the value of 1 for the basic bit; and if an electron is removed, then the basic bit will be changed from 0 to 1, which is equivalent to erasing the memory.

The technology for executing a flash memory can be divided into single level cell (SLC) and multi level cell (MLC), and the MLC flash memory has a memory density twice as large as that of the SLC flash memory, and thus the MLC flash memory has a capacity higher than the SLC flash memory and gives the advantage of lighter, thinner, shorter and smaller features, and lower the cost per megabyte.

However, the electric charge and discharge properties of the flash memory physically restrict the number of times for writing and reading data, and each cell of the MLC flash memory only allows 10000 times of writing and reading data repeatedly, and each cell of the SLC flash memory can offer 100000 times of writing and reading data repeatedly. The high-capacity MLC flash memory only provides 10000 times for writing and reading data, and thus the cell will exceed its maximum number of writing and reading data and will be labeled as a bad sector. The life of the flash memory is reduced by the increase of bad sectors, and thus a method for recycling or rearranging the bad sectors in a flash memory is needed to extend the life expectancy of the flash memory.

SUMMARY OF THE INVENTION

It is a primary objective of the present invention to provide a method for recycling a flash memory that rearranges the bad sectors to provide a number of repeated uses of the flash memory that exceeds an allowable upper limit of uses, so that the flash memory device originally incapable of reading or writing data can be used again, and the life expectancy of the flash memory can be extended.

The method for recycling a flash memory in accordance with the present invention comprises the steps of: scanning the distribution of bad sectors in a flash memory; examining the number of bad sectors in the flash memory to determine whether or not the number of bad sectors exceeds an allowable upper limit of bad sectors saved in a firmware of the flash memory; rearranging the capacity of cells; centralizing the bad sectors in a cell; deleting the cell with centralized bad sectors (which is the cell labeled as a useless cell); or rearranging the cells of the flash memory by marking the area with densely distributed bad sectors as a new cell and deleting such cell; recording the distribution position of the bad sectors and storing the position in the flash memory; and reformatting the flash memory and writing a USB data, a main boot record and a file allocation table into the flash memory.

DETAILED DESCRIPTION OF THE PREFERRED EMBODIMENTS

The above and other objects, features and advantages of the present invention will become apparent from the following detailed description taken with the accompanying drawing.

Due to the electric charge and discharge properties of the flash memory, the number of times for writing and reading data is restricted. Manufacturers count the number of times of writing and reading data in a sector of the flash memory and store the count in a firmware, such that after the count reaches a specific maximum number, that particular sector is labeled as a useless sector. Therefore, the flash memory may shorten its life by the high frequency of uses. The present invention provides a method for recycling the flash memory and recording and rearranging the positions of bad sectors. Before the recycling method is carried out, it is necessary to confirm that the data in the flash memory is stored temporarily in another storage device (such as a hard disk of a computer or a portable electronic device) to assure any possible data loss during the process of the recycling method, and the recycling method will be described as follows.

Figure 1:
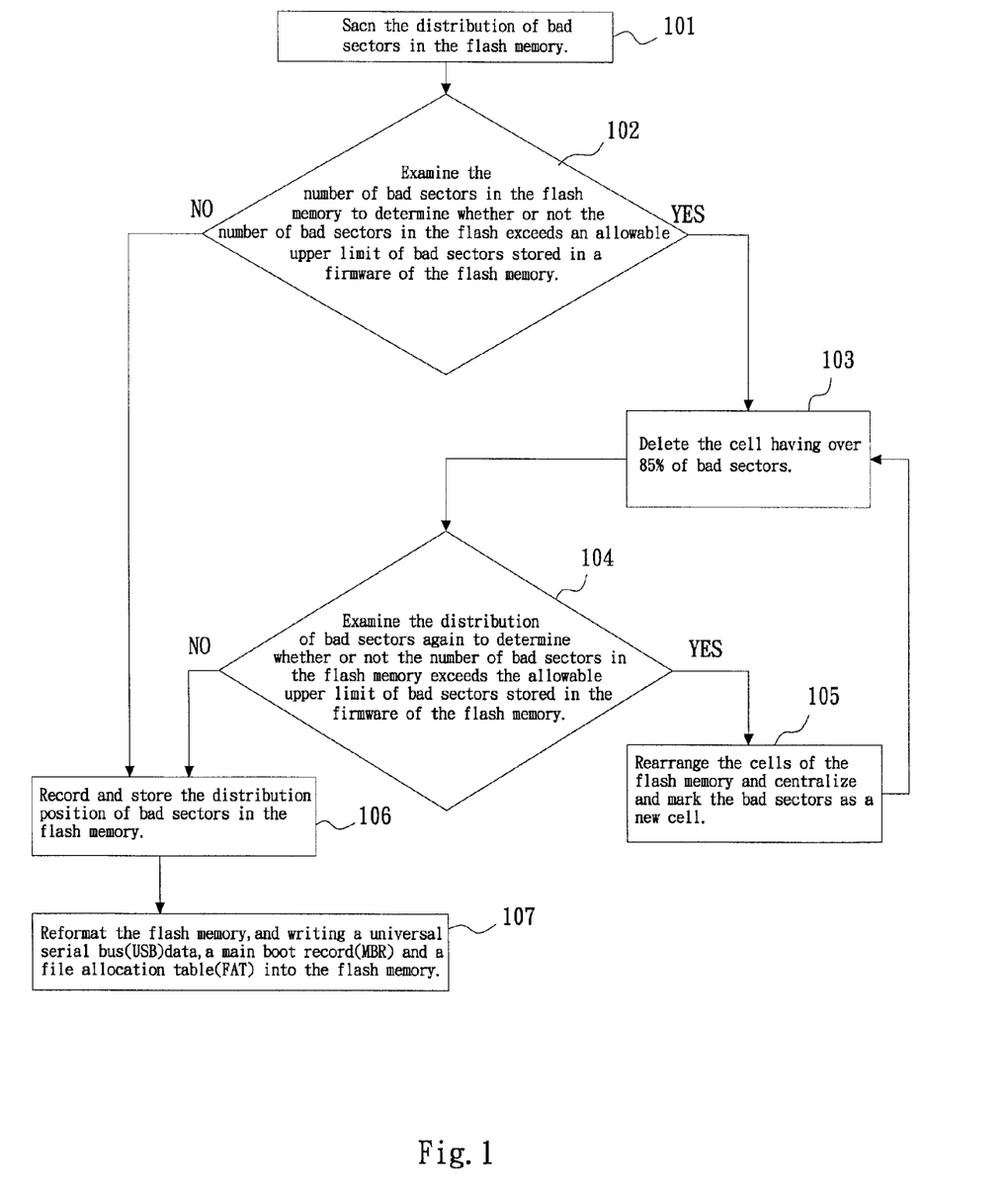
FIG. 1 is a flow chart of the procedure according to a first preferred embodiment of the invention.

Referring to FIG. 1 for the flow chart of the procedure according to a first preferred embodiment of the present invention, the procedure comprises the steps of: (Step 101) scanning the distribution of bad sectors in the flash memory; (Step 102) examining the number of bad sectors in the flash memory to determine whether or not the number of bad sectors exceeds an allowable upper limit of bad sectors stored in a firmware of the flash memory; (Step 103) deleting the cell having over 85% of bad sectors (or labeling the cell as a useless cell) if the number of bad sectors in the flash memory exceeds the allowable upper limit of bad sectors stored in the firmware of the flash memory, or going to Step 106 if the distribution of bad sector of the cell as described in (Step 102) does not exceed the allowable upper limit of bad sectors; (Step 104) checking the distribution of bad sectors again to determine whether or not the number of bad sectors in the flash memory exceeds the allowable upper limit of bad sectors stored in the firmware of the flash memory, and going to Step 105 if the number of bad sectors exceeds the allowable upper limit of bad sectors stored in the firmware of the flash memory; (Step 105) rearranging the cells of the flash memory, and centralizing and marking the bad sectors as a new cell, and repeating Step 103, and deleting the cell having a number of bad sectors that exceeds the 85% of the total number of sectors in a cell; going to Step 106 if the distribution of bad sectors in the cell as described in Step 102 does not exceed the allowable upper limit of bad sectors; (Step 106) recording and storing the distribution position of bad sectors into the flash memory; and (Step 107) reformatting the flash memory and writing a universal serial bus (USB) data, a main boot record (MBR) and a file allocation table (FAT) into the flash memory.

Figure 2:
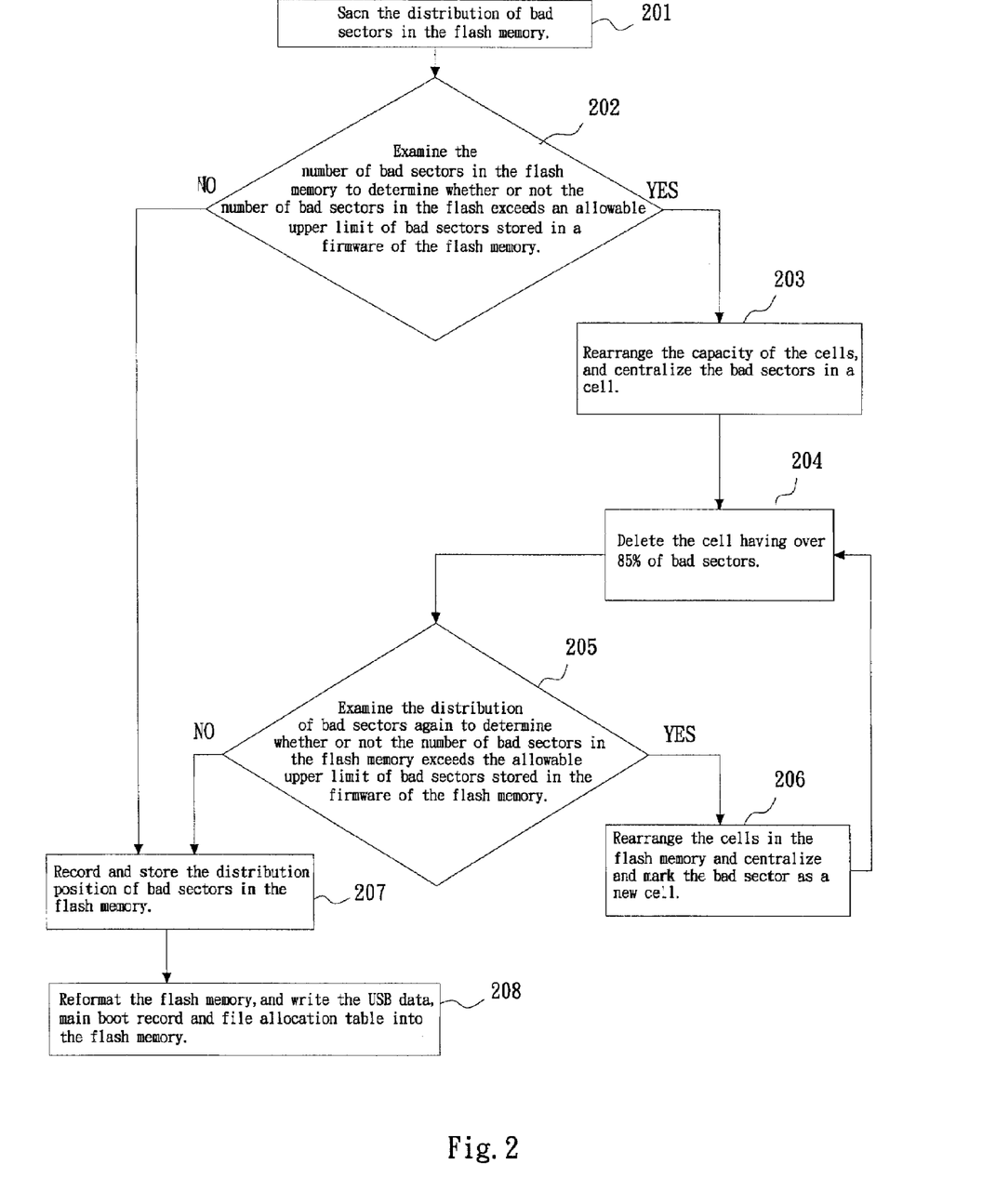
FIG. 2 is a flow chart of the procedure according to a second preferred embodiment of the invention.

Referring to FIG. 2 for the flow chart of the procedure according to a second preferred embodiment of the present invention, the procedure comprises the steps of: (Step 201) scanning the distribution of bad sectors in a flash memory; (Step 202) examining the number of bad sectors in the flash memory to determine whether or not the number of bad sectors in the flash exceeds an allowable upper limit of bad sectors stored in a firmware of the flash memory; and going to Step 203 if the number of bad sectors in the flash memory exceeds the allowable upper limit of bad sectors stored in the firmware of the flash memory; (Step 203) rearranging the capacity of the cells, and centralizing the bad sectors in a cell and then going to Step 204 or going to Step 207 if the number of bad sectors in the flash memory does not exceed the allowable upper limit of bad sectors stored in the firmware of the flash memory; (Step 204) deleting a cell having a number of bad sectors that exceeds 85% of the total number of sectors in a cell (i.e. labeling the cell as a useless cell); (Step 205) examining the distribution of bad sectors again to determine whether or not the number of bad sectors in the flash memory exceeds the allowable upper limit of bad sectors stored in the firmware of the flash memory, and going to Step 206 if the number of bad sectors in the flash memory still exceeds the allowable upper limit of bad sectors stored in the firmware of the flash memory; (Step 206) rearranging the cells in the flash memory and centralizing and marking the bad sector as a new cell, and then repeating Step 204, and deleting the cell having a number of bad sectors that exceeds 85% of the total number of sectors in the cell; and going to Step 207 if the distribution of bad sectors in the cell as described in Step 205 does not exceed the allowable upper limit of bad sectors; (Step 207) recording the distribution position of bad sectors and storing the distribution position in the flash memory; and (Step 208) reformatting the flash memory, and writing the USB data, main boot record and file allocation table into the flash memory.

Figure 3:
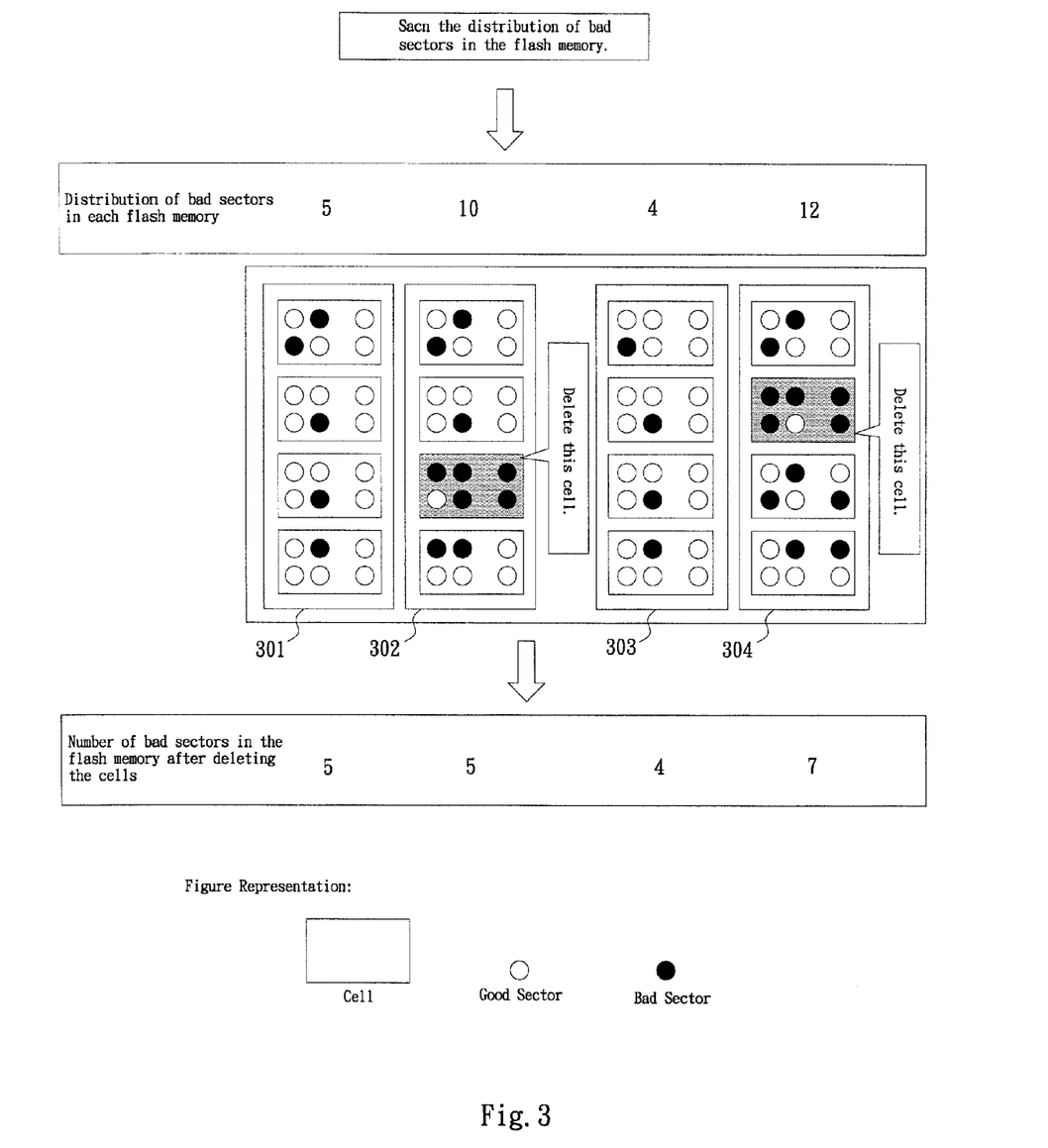
FIG. 3 is a schematic view of deleting an irregular sector of a flash memory where bad sectors are densely distributed according to the present invention.

Referring to FIG. 3 for the schematic view of deleting an irregular sector of a flash memory where bad sectors are densely distributed according to the present invention, the distribution of bad sectors in the flash memory is scanned first, wherein a first flash memory 301 has 5 bad sectors, a second flash memory 302 has 10 bad sectors, a third flash memory 303 has 4 bad sectors, a fourth flash memory 304 has 12 bad sectors, and manufacturers set the allowable upper limit of bad sectors stored in a firmware of the flash memory to 8. In a third cell of the second flash memory 302, five out of six sectors in the third cell are bad sectors, and thus the number of bad sectors exceeds 85% of the total number of sectors in the cell, and this cell will be deleted. Similarly, in the third cell of the fourth flash memory 304, five out of six sectors in the cell are bad sectors, and thus this cell will be deleted. Therefore, the number of bad sectors in the second flash memory 302 is equal to 5 and the number of bad sectors in the fourth flash memory 304 is equal to 7, after the recycling method of the invention is executed, and both numbers are less than 8 (the allowable upper limit of bad sectors stored in the firmware of the flash memory). From the description above, the capacities of the second flash memory 302 and fourth flash memory 304 become smaller due to the recycling method, but the life expectancy of the flash memory can be extended. By scarifying a little cost, the invention can achieve the effects of extending the life expectancy and enhancing the reliability of the flash memory.

Figure 4:
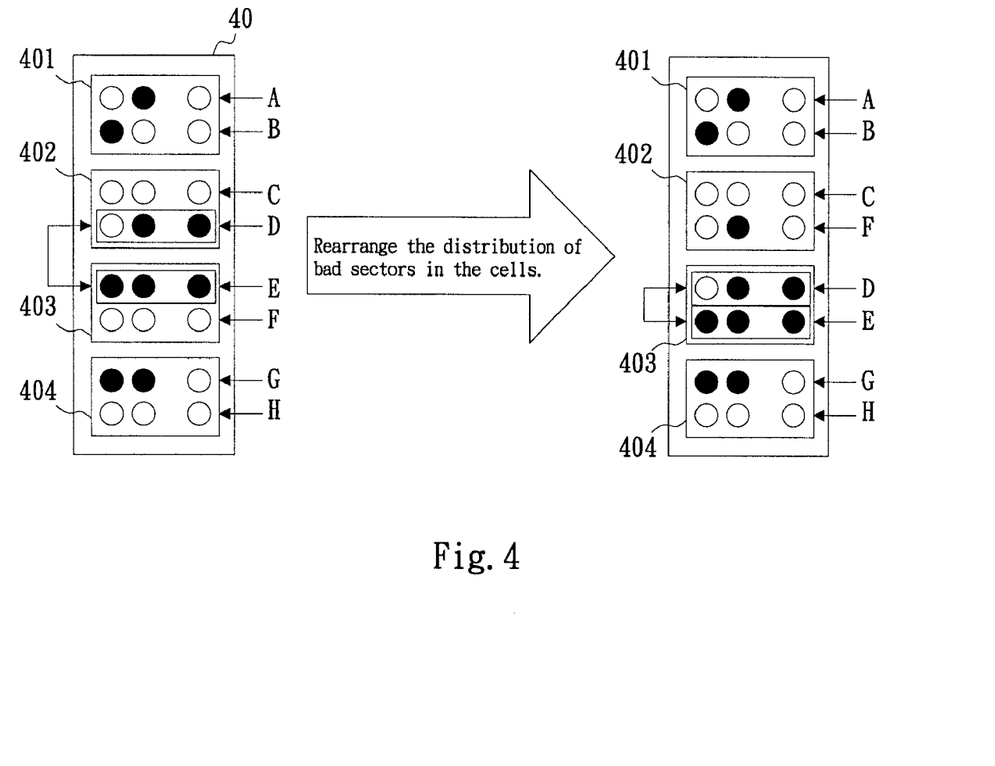
FIG. 4 is a schematic view of rearranging the distribution of blocks in a cell according to a preferred embodiment of the present invention.

Referring to FIG. 4 for the schematic view of rearranging the distribution of blocks in a cell according to a preferred embodiment of the present invention, the flash memory 40 has a first cell 401, a second cell 402, a third cell 403 and a fourth cell 404, and the first cell 401 is divided into Columns A and B, and the second cell 402 is divided into Columns C and D, and the third cell 403 is divided into Columns E and F, and the fourth cell 404 is divided into Columns G and H, This flash memory 40 has a total of 10 bad sectors. As shown in FIG. 4, Column D of the second cell 402 and Column E of the third cell 403 are areas having densely distributed bad sectors. When the cells are rearranged, these two columns D, E are put in the same cell. After the cells are rearranged, the first cell 401 is divided into Columns A and B, and the second cell 402 is divided into Columns C and F, and the third cell 403 is divided into Columns D and E, and the fourth cell 404 is divided into Columns G and H. From FIG. 4, the third cell 403 is an area with centralized bad sectors, and thus the third cell will be deleted. The number of bad sectors in this flash memory 40 is only 5 after the process of the recycling method has taken place, and similarly the present invention can achieve the effects of extending the life expectancy and enhancing the reliability of the flash memory.

Figure 5:
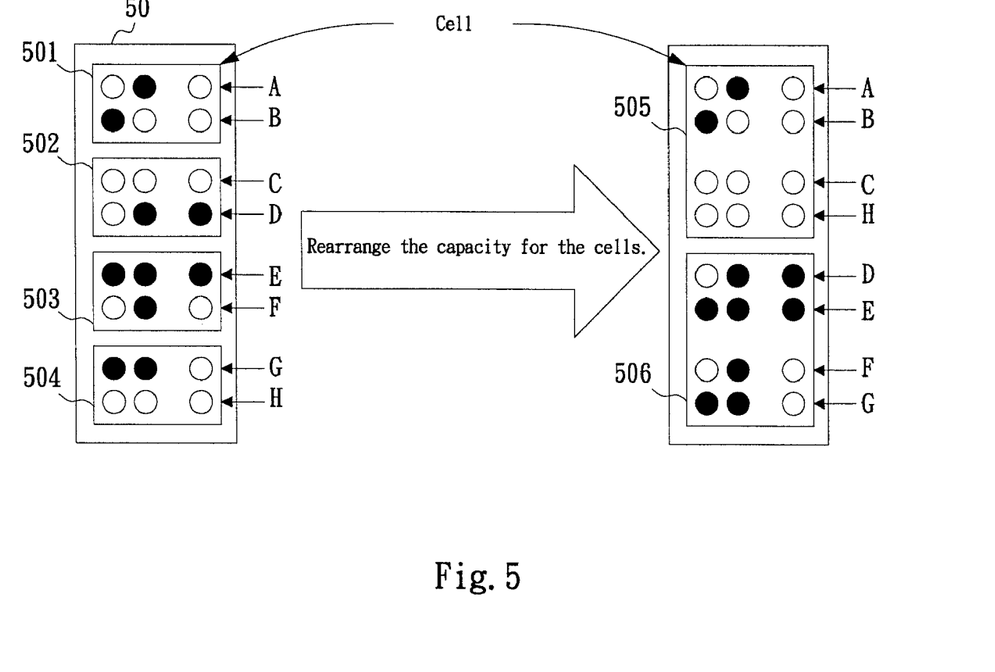
FIG. 5 is a schematic view of rearranging the capacity of a cell in a preferred embodiment of the present invention.

Referring to FIG. 5 for the schematic view of rearranging the capacity of a cell in a preferred embodiment of the present invention, the flash memory 50 has a first cell 501, a second cell 502, a third cell 503 and a fourth cell 504, and the first cell 501 is divided into Columns A and B, and the second cell 502 is divided into Columns C and D, and the third cell 503 is divided into Columns E and F, and the fourth cell 504 is divided into Columns G and H. This flash memory 50 has a total 10 bad sectors. If the capacity of the cell for Column D of the second cell, Column E of the third cell, Column F of the third cell and Column G of the fourth cell are rearranged, these four columns D, E, F, G are put in the same cell. After the capacity of the cell is rearranged, a new first cell 505 and a new second cell 506 are formed, and the second cell 506 with centralized bad sectors will be deleted. The number of bad sectors of this flash memory 50 is equal to 2 after the process of the recycling method has taken place, and similarly the present invention can achieve the effects of extending the life expectancy and enhancing the reliability of the flash memory.

Figure 6:
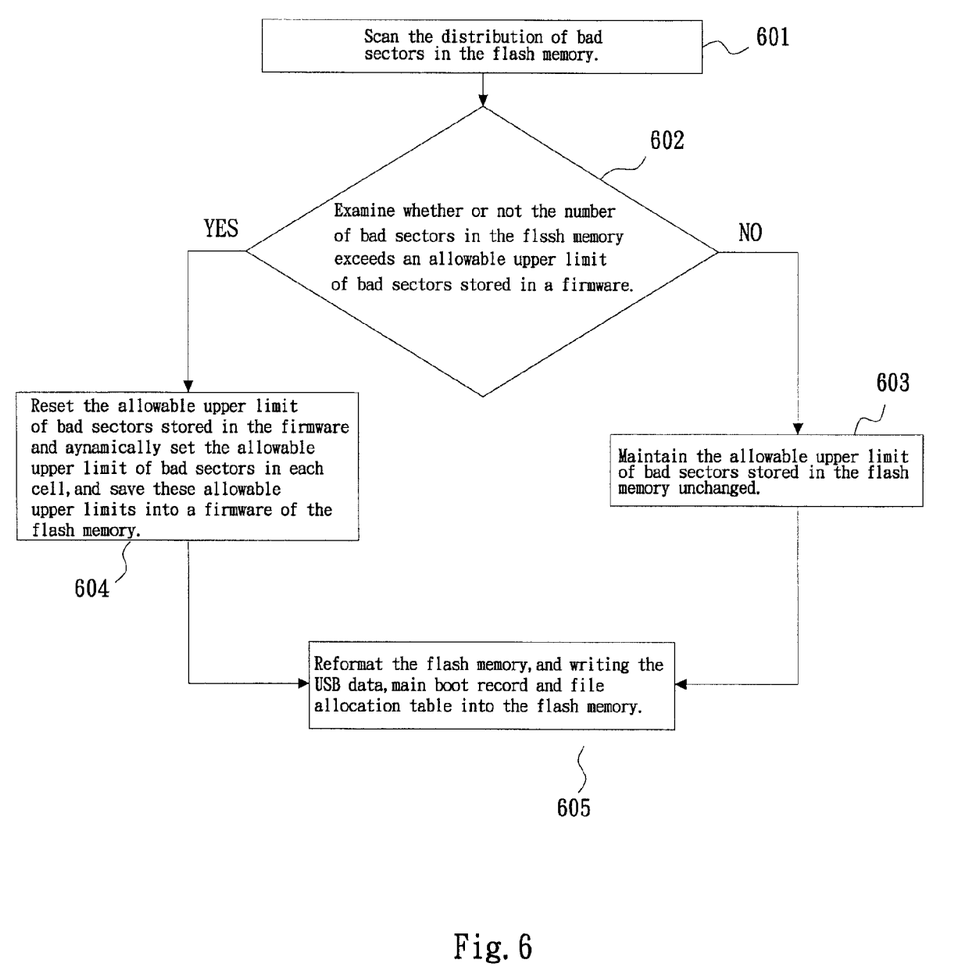
FIG. 6 is a flow chart of the procedure according to a third preferred embodiment of the present invention.

Referring to FIG. 6 for the flow chart of the procedure according to a third preferred embodiment of the present invention, the procedure comprises the steps of: (Step 601) scanning the distribution of bad sectors in the flash memory; (Step 602) examining whether or not there is any bad sector in the flash memory and then going to Step 603 if the number of bad sectors in the flash memory does not exceed an allowable upper limit of bad sectors stored in a firmware; (Step 603) maintaining the allowable upper limit of bad sectors stored in the flash memory unchanged, and then going to Step (603) if the number of bad sectors in the flash memory exceeds the allowable upper limit of bad sectors stored in the firmware as described in Step 602; (Step 604) resetting the allowable upper limit of bad sectors stored in the firmware and dynamically setting the allowable upper limit of bad sectors in each cell, and saving these allowable upper limits into a firmware of the flash memory; (Step 605) reformatting the flash memory, and writing the USB data, main boot record and file allocation table into the flash memory.

Figure 7:
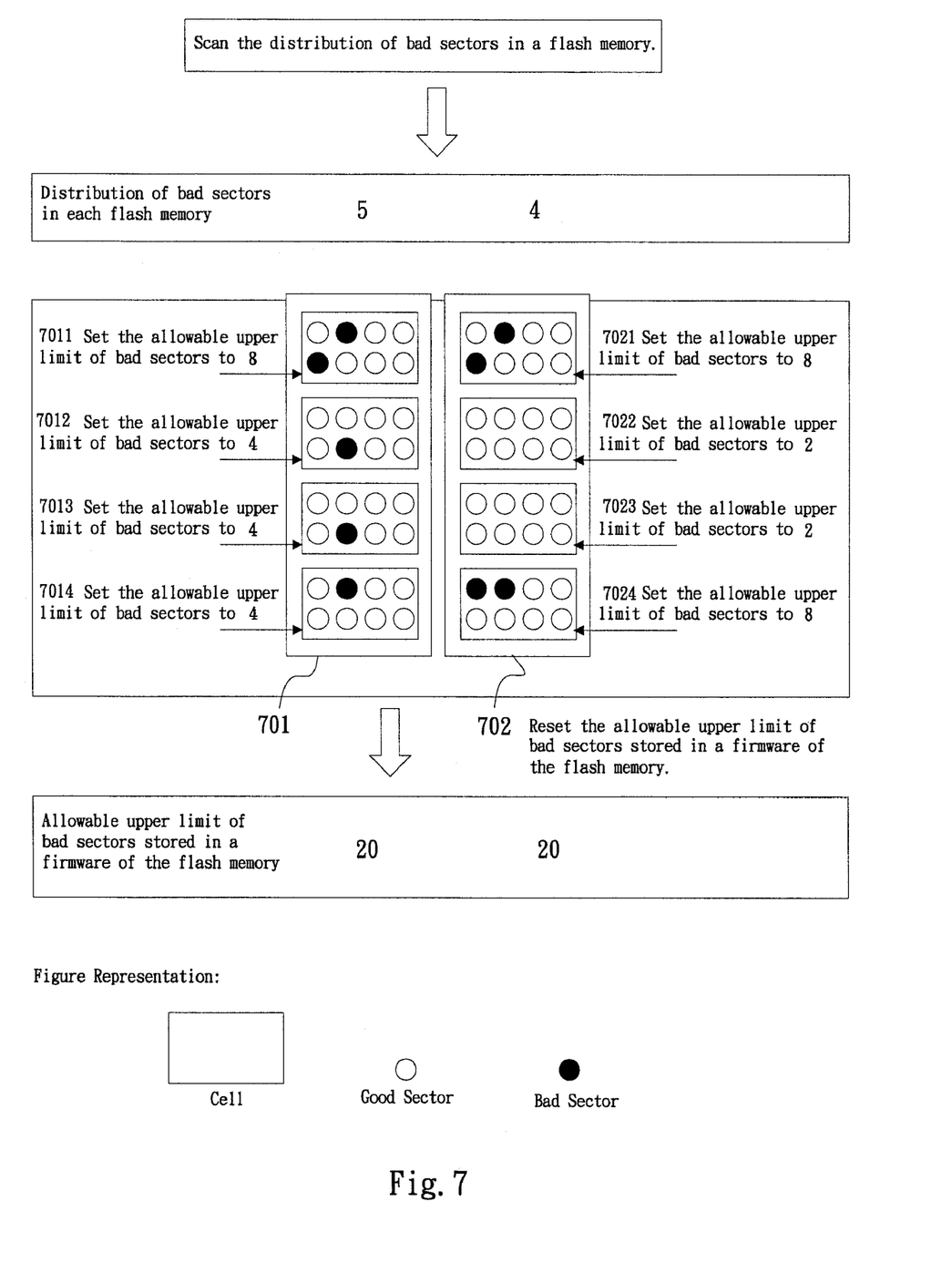
FIG. 7 is a block diagram of restricting the number of bad sectors in each cell by a dynamic setting method according to a third preferred embodiment of the present invention.

Referring to FIG. 7 for the block diagram of restricting the number of bad sectors in each cell by a dynamic setting method according to a third preferred embodiment of the present invention, the allowable upper limit of bad sectors in each cell set dynamically as illustrated in FIG. 6 can be accomplished by a formula; and the first cell 7011 of the first flash memory 701 is taken for example. Assumed that the allowable upper limit of bad sectors stored in a firmware of the first flash memory 701 is equal to X=20, the number of cells containing no bad sector in the first flash memory 701 is equal to Y=0, the total number of bad sectors in the first flash memory 701 is Z=5, and the number of bad sectors in the first cell 7011 is equal to W=2, and the formula used for dynamically setting the allowable upper limit of bad sectors in the cell is given by F=((X−Y*2)/Z)*W=((20−0*2)/5)*2=8, and this formula can be used to compute the upper allowable limit of bad sectors of the first cell 7011 (which is equal to 8). Similarly, the allowable upper limit of bad sectors in the second cell 7012 is equal to 4, and the allowable upper limit of bad sectors in the third cell 7013 is equal to 4, the allowable upper limit of bad sectors in the fourth cell 7014 is equal to 4, and the total number of bad sectors in the first flash memory 701 is limited to 8+4+4+4=20. The same formula can be used to obtain the allowable upper limits of bad sectors in the first cell 7021, second cell 7022, third cell 7023 and fourth cell 7024 of the second flash memory 702 are 8, 2, 2 and 8 respectively.

In the foregoing preferred embodiment, the number of sectors, the number of cells, the number of sectors in a cell, the number of bad sectors, the distribution of bad sectors or the maximum number of bad sectors stored in the firmware of the flash memory are provided as examples, and the persons skilled in the art can modify these numbers according to the capacity of the flash memory or the default settings specified by manufacturers, and thus these numbers are not intended to restrict the scope of the present invention.

The flash memory of the present invention is a flash memory with a universal serial bus (USB) interface; or this flash memory is a flash memory card such as a compact flash (CF), a multi-media card (MMC), a memory stick card (MSC), a smart media card (SMC) or a smart disk (SD). The flash memory could be a single level cell (SLC) flash memory, a multi level cell (MLC) flash memory, a NAND flash memory or a NOR flash memory, that can use the recycling method of the present invention to extend the life expectancy and enhance the reliability of the flash memory.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

In summation of the description above, the method for recycling a flash memory of the present invention effectively overcomes the shortcomings of the prior art, enhances the performance over the conventional structure and complies with the patent application requirements.

What is claimed is:

1. A method for recycling flash memory, comprising the steps of:
    scanning the distribution of bad sectors of a flash memory;
    examining the number of bad sectors in said flash memory to determine whether or not the number of bad sectors exceeds an allowable upper limit of bad sectors stored in a firmware of said flash memory;
    rearranging said sectors in a plurality of cells of said flash memory, and marking said bad sectors in said plurality of cells as a new cell to define a new cell with densely distributed bad sectors, if the number of bad sectors in said flash memory exceeds said allowable upper limit of bad sectors stored in said firmware of said flash memory;
    labeling said cell with densely distributed bad sectors as a useless cell;
    recording the distribution position of said bad sectors and saving said distribution position in said flash memory; and
    reformatting said flash memory, and writing a universal serial bus (USB) data, a main boot record (MBR) and a file allocation table (FAT) into said flash memory.

2. The method of claim 1, wherein said flash memory is one selected from the collection of a NAND flash memory, a NOR flash memory, a single level cell flash memory and a multi level cell flash memory.

3. The method of claim 1, wherein said bad sectors are distributed densely, such that the number of bad sectors exceeds 85% of the total number of sectors in a cell having said bad sectors.

4. A method for recycling flash memory, comprising the steps of:
    scanning the distribution of bad sectors in a flash memory;
    examining the number of bad sectors in said flash memory to determine whether or not the number of bad sectors exceeds an allowable upper limit of bad sectors stored in a firmware of said flash memory;
    rearranging the number of sectors of at least one cell, and centralizing said bad sectors to at least one new cell which is a cell with densely distributed bad sectors if the maximum number of bad sectors in said flash memory exceeds said allowable upper limit of bad sectors; and labeling said cell with densely distributed bad sectors as a useless cell; and recording the distribution position of said bad sectors and saving said distribution position into said flash memory; and
    reformatting said flash memory, and writing a universal serial bus (USB) data, a main boot record (MBR) and a file allocation table (FAT) into said flash memory.

5. The method of claim 4, wherein said flash memory is one selected from the collection of a NAND flash memory, a NOR flash memory, a single level cell flash memory and a multi level cell flash memory.

6. The method of claim 4, wherein said bad sectors are distributed densely, such that the number of bad sectors exceeds 85% of the total number of sectors in a cell having said bad sectors.

7. A method for recycling flash memory, comprising the steps of:
    scanning the distribution of bad sectors in a flash memory;
    examining the number of bad sectors in said flash memory to determine whether or not the number of bad sectors exceeds an allowable upper limit of bad sectors stored in a firmware of said flash memory;
    resetting said allowable upper limit of bad sectors stored in said firmware of said flash memory, and dynamically setting the maximum number of bad sectors for each cell, and saving said maximum number of bad sectors in said firmware of said flash memory, if the number of bad sections in said flash memory exceeds said allowable upper limit of bad sectors; and reformatting said flash memory, and writing a universal serial bus (USB) data, a main boot record (MBR) and a file allocation table (FAT) into said flash memory.

8. The method of claim 7, wherein said flash memory is one selected from the collection of a NAND flash memory, a NOR flash memory, a single level cell flash memory and a multi level cell flash memory.

9. The method of claim 7, wherein said bad sectors are distributed densely, such that the number of bad sectors exceeds 85% of the total number of sectors in a cell having said bad sectors.

* * * * *